(12) United States Patent
Wakiyama et al.

(10) Patent No.: US 9,691,805 B2
(45) Date of Patent: *Jun. 27, 2017

(54) SEMICONDUCTOR DEVICE, METHOD FOR MANUFACTURING THE SAME, AND ELECTRONIC DEVICE

(71) Applicant: Sony Corporation, Tokyo (JP)

(72) Inventors: Satoru Wakiyama, Kanagawa (JP); Hiroshi Ozaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/010,992

(22) Filed: Jan. 29, 2016

(65) Prior Publication Data

US 2016/0163756 A1 Jun. 9, 2016

Related U.S. Application Data

(63) Continuation of application No. 14/297,779, filed on Jun. 6, 2014, now Pat. No. 9,275,922, which is a (Continued)

(30) Foreign Application Priority Data

May 14, 2010 (JP) .................................. 2010-111910

(51) Int. Cl.
*H01L 27/146* (2006.01)
*H01L 21/56* (2006.01)
(Continued)

(52) U.S. Cl.
CPC ........ *H01L 27/14636* (2013.01); *H01L 21/56* (2013.01); *H01L 21/563* (2013.01); (Continued)

(58) Field of Classification Search
CPC ..................................................... H01L 27/146
See application file for complete search history.

(56) References Cited

U.S. PATENT DOCUMENTS

| 2004/0263668 | A1* | 12/2004 | Kim | ..................... H04N 5/2251 348/340 |
| 2006/0023109 | A1* | 2/2006 | Mabuchi | ................ H04N 5/335 348/340 |

(Continued)

*Primary Examiner* — Jason Flohre
(74) *Attorney, Agent, or Firm* — Sheridan Ross P.C.

(57) ABSTRACT

Disclosed herein is a semiconductor device including: a first semiconductor chip having an electronic circuit section and a first connecting section formed on one surface thereof; a second semiconductor chip having a second connecting section formed on one surface thereof, the second semiconductor chip being mounted on the first semiconductor chip with the first and the second connecting sections connected to each other by a bump; a dam formed to fill a gap between the first and the second semiconductor chips on a part of an outer edge of the second semiconductor chip, the part of the outer edge being on a side of a region of formation of the electronic circuit section; and an underfill resin layer filled into the gap, protrusion of the resin layer from the outer edge of the second semiconductor chip to a side of the electronic circuit section being prevented by the dam.

20 Claims, 12 Drawing Sheets

Related U.S. Application Data continuation of application No. 13/086,830, filed on Apr. 14, 2011, now Pat. No. 8,773,583.

(51) Int. Cl.
*H01L 25/065* (2006.01)
*H01L 23/31* (2006.01)
*H01L 23/00* (2006.01)

(52) U.S. Cl.
CPC ............. *H01L 23/31* (2013.01); *H01L 24/14* (2013.01); *H01L 24/17* (2013.01); *H01L 24/81* (2013.01); *H01L 25/0657* (2013.01); *H01L 27/1469* (2013.01); *H01L 27/14605* (2013.01); *H01L 27/14618* (2013.01); *H01L 27/14634* (2013.01); *H01L 24/05* (2013.01); *H01L 24/16* (2013.01); *H01L 2224/0401* (2013.01); *H01L 2224/05571* (2013.01); *H01L 2224/05624* (2013.01); *H01L 2224/14515* (2013.01); *H01L 2224/16145* (2013.01); *H01L 2224/16225* (2013.01); *H01L 2224/16235* (2013.01); *H01L 2224/26145* (2013.01); *H01L 2224/26175* (2013.01); *H01L 2224/27013* (2013.01); *H01L 2224/29011* (2013.01); *H01L 2224/29035* (2013.01); *H01L 2224/32145* (2013.01); *H01L 2224/32225* (2013.01); *H01L 2224/73103* (2013.01); *H01L 2224/73104* (2013.01); *H01L 2224/73203* (2013.01); *H01L 2224/73204* (2013.01); *H01L 2224/81191* (2013.01); *H01L 2224/81193* (2013.01); *H01L 2224/81801* (2013.01); *H01L 2224/83051* (2013.01); *H01L 2224/83104* (2013.01); *H01L 2224/83365* (2013.01); *H01L 2224/92125* (2013.01); *H01L 2225/06513* (2013.01); *H01L 2225/06541* (2013.01); *H01L 2924/0002* (2013.01); *H01L 2924/00014* (2013.01); *H01L 2924/014* (2013.01); *H01L 2924/0105* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01082* (2013.01); *H01L 2924/15788* (2013.01)

(56) References Cited

U.S. PATENT DOCUMENTS

| | | | |
|---|---|---|---|
| 2007/0007667 A1* | 1/2007 | Kim | H01L 27/14618 257/783 |
| 2009/0008765 A1* | 1/2009 | Yamano | H01L 24/83 257/690 |
| 2010/0244175 A1* | 9/2010 | Park | H04N 5/2257 257/459 |

\* cited by examiner

SEMICONDUCTOR DEVICE, METHOD FOR MANUFACTURING THE SAME, AND ELECTRONIC DEVICE

CROSS-REFERENCE TO RELATED APPLICATIONS

This application is a continuation of U.S. patent application Ser. No. 14/297,779, filed Jun. 6, 2014, which is a continuation of U.S. patent application Ser. No. 13/086,830, filed Apr. 14, 2011, now U.S. Pat. No. 8,773,583, which claims priority to Japanese Patent Application No. JP 2010-111910, filed in the Japan Patent Office on May 14, 2010, the entire disclosures of which are hereby incorporated herein by reference.

BACKGROUND OF THE INVENTION

1. Field of the Invention

The present invention relates to a semiconductor device, a method for manufacturing the same, and an electronic device, and particularly to a semiconductor device packaged by mounting a second semiconductor chip on a first semiconductor chip having an electronic circuit section such as a solid-state imaging element section or the like, a method for manufacturing the same, and an electronic device having the same.

2. Description of the Related Art

A package structure referred to as a chip-on-chip (CoC) package, which includes a plurality of semiconductor chips laminated and sealed within the single package to achieve miniaturization, high functionality and the like of a semiconductor device, has been put to practical use.

The CoC package is also applied to for example a structure in which a memory element and a processor element are laminated, and progress has been made in practical use of the CoC package as a SIP (System in Package) type semiconductor device.

For example, when an SIP is formed by a CoC package as in Japanese Patent Laid-Open No. 2008-192815 (hereinafter referred to as Patent Document 1), the application of flip chip connection is principally considered for connection between an upper semiconductor chip and a lower semiconductor chip.

In the case where flip chip connection is applied to connection between semiconductor chips in a CoC package, a first semiconductor chip (lower stage side semiconductor chip) is mounted on a wiring board having an external connection terminal and the like.

A second semiconductor chip (upper stage side semiconductor chip) is flip-chip-connected to the first semiconductor chip.

That is, electrical and mechanical connection between the first and second semiconductor chips is made by connecting a bump electrode provided on the upper surface of the first semiconductor chip and a bump electrode provided on the lower surface of the second semiconductor chip to each other.

Further, an underfill resin layer is filled into a gap between the first and second semiconductor chips to improve connection reliability and the like.

Japanese Patent Laid-Open Nos. 2005-276879, 2008-252027 and 2008-124140 (hereinafter referred to as Patent Document 2, 3 and 4, respectively), for example, disclose techniques for forming a dam that serves to stop the flow of the underfill resin layer in the case of the structure in which the gap between the first and second semiconductor chips of the CoC package is filled with the underfill resin layer.

The dam is intended mainly to prevent resin contamination caused by a flow of the underfill resin layer into an electronic circuit section such as an Al electrode formed in the first semiconductor chip in a peripheral part of a mounting region of the second semiconductor chip.

In the CoC package of the above-described constitution, a reactant gas is emitted from a fillet of the underfill resin layer, which fillet is formed at the peripheral part of the second semiconductor chip, at a time of resin curing reaction.

In Patent Documents 1 to 4, when a distance between the electronic circuit section such as the Al electrode and the like and the upper semiconductor chip is shortened to miniaturize the CoC package, the above-described gas contaminates the electronic circuit section such as the Al electrode and the like.

As a result, a failure in wire bonding and a degradation in reliability occur, and it is therefore difficult to miniaturize the CoC package.

In addition, in a case where a solid-state imaging element section is formed on the lower semiconductor chip, even when a dam is formed between the solid-state imaging element section and the upper semiconductor chip, the imaging element section is contaminated by the reactant gas emitted from the fillet of the above-described underfill resin layer, and thus an imaging characteristic is degraded.

In addition, a semiconductor device in which rewiring is formed on a glass substrate or the like and a semiconductor chip having a solid-state imaging section formed thereon is flip-chip-connected is under study.

In order to prevent a resin protecting a bump electrode from contaminating the light receiving surface of the solid-state imaging section, techniques for forming a dam between the bump electrode and the semiconductor chip having the solid-state imaging section formed thereon are under study.

However, reference to Japanese Patent Laid-Open Nos. 2007-533131, 2002-118207 and Hei 06-204442 (hereinafter referred Patent Document 5, 6 and 7, respectively) and the like shows that a dam made of a resin is formed on only the side of the glass substrate, and that there is a problem in a sealing property for the side of the semiconductor chip having the solid-state imaging section formed thereon.

In addition, this technique can essentially form a bump electrode only in a peripheral part of a laminated semiconductor chip or the semiconductor chip having a solid-state imaging section formed thereon.

Further, in semiconductor devices disclosed in Patent Documents 6 and 7, no dam is formed on the side of an Al electrode, and there is thus a fear of contamination of the Al electrode.

SUMMARY OF THE INVENTION

A problem to be solved is that when the distance between the electronic circuit section formed on the lower semiconductor chip and the upper semiconductor chip is shortened, the electronic circuit section is contaminated by the reactant gas emitted from the fillet of the underfill resin layer between the upper semiconductor chip and the lower semiconductor chip.

It is thus difficult to achieve miniaturization and a higher degree of integration of the semiconductor device by shortening the distance between the upper semiconductor chip and the electronic circuit section formed on the lower semiconductor chip.

According to an embodiment of the present invention, there is provided a semiconductor device including: a first semiconductor chip having an electronic circuit section formed at least on one surface of the first semiconductor chip, and having a first connecting section formed on a same surface as the surface of formation of the electronic circuit section; a second semiconductor chip having a second connecting section formed on one surface of the second semiconductor chip, the second semiconductor chip being mounted on the first semiconductor chip with the first connecting section and the second connecting section connected to each other by a bump; a dam formed so as to fill a gap between the first semiconductor chip and the second semiconductor chip on at least a part of an outer edge of the second semiconductor chip, the part of the outer edge of the second semiconductor chip being on a side of a region of formation of the electronic circuit section; and an underfill resin layer filled into the gap between the first semiconductor chip and the second semiconductor chip, protrusion of the underfill resin layer from the outer edge of the second semiconductor chip to a side of the electronic circuit section being prevented by the dam.

In the semiconductor device according to the above-described embodiment of the present invention, a second semiconductor chip having a second connecting section formed on one surface of the second semiconductor chip is mounted on a first semiconductor chip having an electronic circuit section formed at least on one surface of the first semiconductor chip, and having a first connecting section formed on a same surface as the surface of formation of the electronic circuit section, with the first semiconductor chip and the second semiconductor chip connected to each other at the first connecting section and the second connecting section by a bump.

In this case, a dam for filling a gap between the first semiconductor chip and the second semiconductor chip is formed on at least a part of an outer edge of the second semiconductor chip, the part of the outer edge of the second semiconductor chip being on a side of a region of formation of the electronic circuit section.

An underfill resin layer is filled into the gap between the first semiconductor chip and the second semiconductor chip, protrusion of the underfill resin layer from the outer edge of the second semiconductor chip to a side of the electronic circuit section being prevented by the dam.

In addition, according to an embodiment of the present invention, there is provided a method for manufacturing a semiconductor device, the method including the steps of: forming an electronic circuit section at least on one surface of a first semiconductor chip, and forming a first connecting section on a same surface as the surface of formation of the electronic circuit section; forming a second connecting section on one surface of a second semiconductor chip; mounting the second semiconductor chip on the first semiconductor chip with the first connecting section and the second connecting section connected to each other by a bump; forming a dam for filling a gap between the first semiconductor chip and the second semiconductor chip on at least a part of an outer edge of the second semiconductor chip, the part of the outer edge of the second semiconductor chip being on a side of a region of formation of the electronic circuit section; and forming an underfill resin layer so as to fill the underfill resin layer into the gap between the first semiconductor chip and the second semiconductor chip, protrusion of the underfill resin layer from the outer edge of the second semiconductor chip to a side of the electronic circuit section being prevented by the dam.

In the method for manufacturing the semiconductor device according to the above-described embodiment of the present invention, an electronic circuit section is formed at least on one surface of a first semiconductor chip, and a first connecting section is formed on a same surface as the surface of formation of the electronic circuit section.

In addition, a second connecting section is formed on one surface of a second semiconductor chip.

Next, the second semiconductor chip is mounted on the first semiconductor chip with the first connecting section and the second connecting section connected to each other by a bump.

In the above, a dam for filling a gap between the first semiconductor chip and the second semiconductor chip is formed on at least a part of an outer edge of the second semiconductor chip, the part of the outer edge of the second semiconductor chip being on a side of a region of formation of the electronic circuit section.

Next, an underfill resin layer is formed so as to be filled into the gap between the first semiconductor chip and the second semiconductor chip, protrusion of the underfill resin layer from the outer edge of the second semiconductor chip to a side of the electronic circuit section being prevented by the dam.

According to an embodiment of the present invention, there is provided an electronic device including: a solid-state imaging device; an optical system for guiding incident light to an imaging section of the solid-state imaging device; and a signal processing circuit for processing an output signal of the solid-state imaging device; wherein the solid-state imaging device includes a first semiconductor chip having a solid-state imaging section formed at least on one surface of the first semiconductor chip, and having a first connecting section formed on a same surface as the surface of formation of the solid-state imaging section, a second semiconductor chip having a second connecting section formed on one surface of the second semiconductor chip, the second semiconductor chip being mounted on the first semiconductor chip with the first connecting section and the second connecting section connected to each other by a bump, a dam formed so as to fill a gap between the first semiconductor chip and the second semiconductor chip on at least a part of an outer edge of the second semiconductor chip, the part of the outer edge of the second semiconductor chip being on a side of a region of formation of the solid-state imaging section, and an underfill resin layer filled into the gap between the first semiconductor chip and the second semiconductor chip, protrusion of the underfill resin layer from the outer edge of the second semiconductor chip to a side of the solid-state imaging section being prevented by the dam.

The electronic device according to the above-described embodiment of the present invention includes: a solid-state imaging device; an optical system for guiding incident light to an imaging section of the solid-state imaging device; and a signal processing circuit for processing an output signal of the solid-state imaging device.

In the solid-state imaging device, a second semiconductor chip having a second connecting section formed on one surface of the second semiconductor chip is mounted on a first semiconductor chip having a solid-state imaging section formed at least on one surface of the first semiconductor chip, and having a first connecting section formed on a same surface as the surface of formation of the solid-state imaging section, with the first semiconductor chip and the second semiconductor chip connected to each other at the first connecting section and the second connecting section by a bump. In addition, a dam for filling a gap between the first semiconductor chip and the second semiconductor chip is formed on at least a part of an outer edge of the second semiconductor chip, the part of the outer edge of the second semiconductor chip being on a side of a region of formation of the solid-state imaging section. Further, an underfill resin layer is filled into the gap between the first semiconductor chip and the second semiconductor chip, protrusion of the underfill resin layer from the outer edge of the second semiconductor chip to a side of the solid-state imaging section being prevented by the dam.

In the semiconductor device according to the above-described embodiment of the present invention, the dam prevents the protrusion of the underfill resin layer between the first and second semiconductor chips from the outer edge of the second semiconductor chip to the side of the electronic circuit section. Thus, the fillet of the underfill resin layer is not formed in the vicinity of the electronic circuit section, and the contamination of the electronic circuit section by a reactant gas emitted from the fillet is prevented.

Thus, it is possible to shorten the distance between the electronic circuit section formed on the first semiconductor chip and the second semiconductor chip, and thus achieve miniaturization and a higher degree of integration of the semiconductor device.

The method for manufacturing the semiconductor device according to the above-described embodiment of the present invention forms the dam to prevent the protrusion of the underfill resin layer between the first and second semiconductor chips from the outer edge of the second semiconductor chip to the side of the electronic circuit section. Thus, the fillet of the underfill resin layer is not formed in the vicinity of the electronic circuit section, and the contamination of the electronic circuit section by a reactant gas emitted from the fillet can be prevented.

Thus, it is possible to shorten the distance between the electronic circuit section formed on the first semiconductor chip and the second semiconductor chip, and thus achieve miniaturization and a higher degree of integration of the semiconductor device.

In the solid-state imaging device forming the electronic device according to the above-described embodiment of the present invention, the dam prevents the protrusion of the underfill resin layer between the first and second semiconductor chips from the outer edge of the second semiconductor chip to the side of the solid-state imaging section. Thus, the fillet of the underfill resin layer is not formed in the vicinity of the solid-state imaging section, and the contamination of the solid-state imaging section by a reactant gas emitted from the fillet is prevented.

Thus, it is possible to shorten the distance between the solid-state imaging section formed on the first semiconductor chip and the second semiconductor chip, and thus achieve miniaturization and a higher degree of integration of the solid-state imaging device.

DETAILED DESCRIPTION OF THE PREFERRED EMBODIMENTS

Preferred embodiments of a solid-state imaging device, a method for manufacturing the same, a designing method, and an electronic device according to the present invention will hereinafter be described with reference to the drawings.

Incidentally, description will be made in the following order.

1. First Embodiment (Basic Constitution of Semiconductor Device and Manufacturing Method)
2. Second Embodiment (Constitution in which Electronic Circuit Section and Second Semiconductor Chip are Formed so as to be Adjacent to each other)
3. Third Embodiment (Constitution in which Dam is Formed in Shape along Outer Edge of Second Semiconductor Chip)
4. Fourth Embodiment (Manufacturing Method Using Resin Film as Underfill Resin Layer)
5. Fifth Embodiment (Constitution in which Dam is Formed by Resin)
6. Sixth Embodiment (Application to Electronic Device)

<First Embodiment>
[Constitution of Semiconductor Device]

Figure 1A:
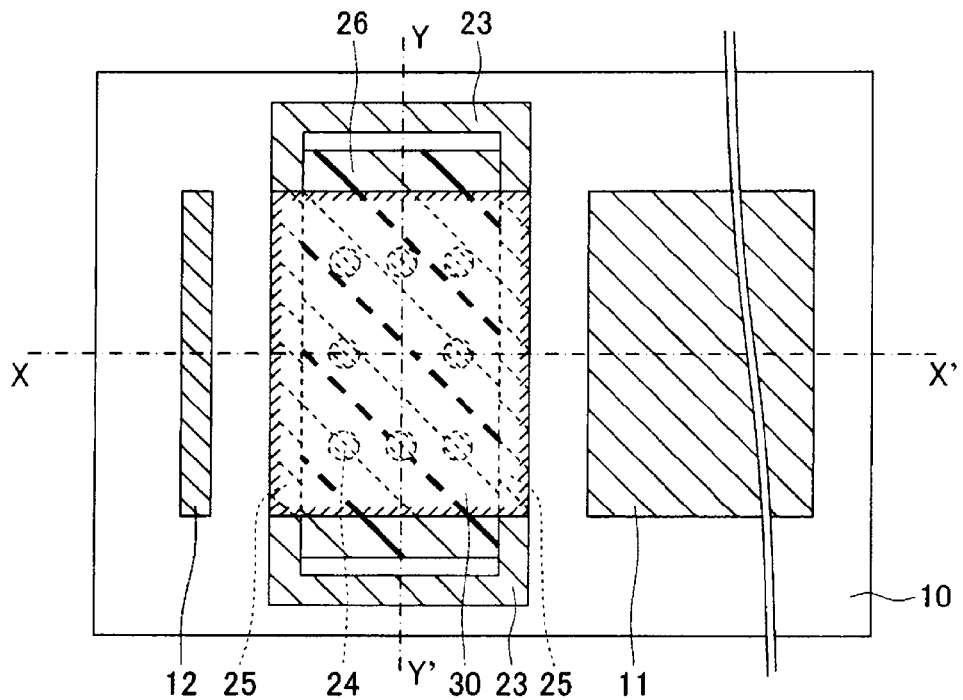
FIG. 1A is a plan view of a semiconductor device according to a first embodiment of the present invention.
Figure 1B:
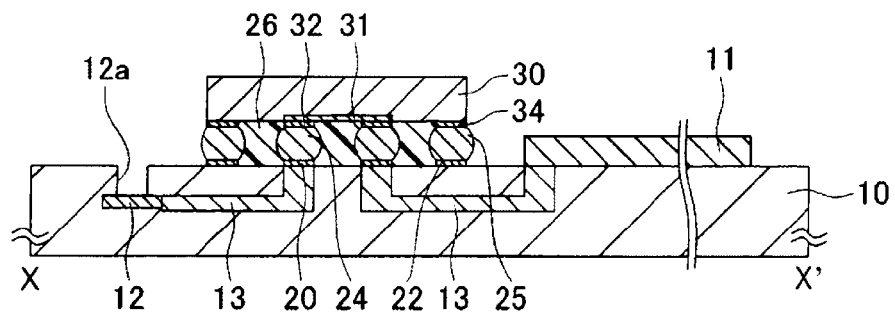
FIG. 1B and FIG. 1C are schematic sectional views taken along lines X-X' and Y-Y', respectively, of FIG. 1A.
Figure 1C:
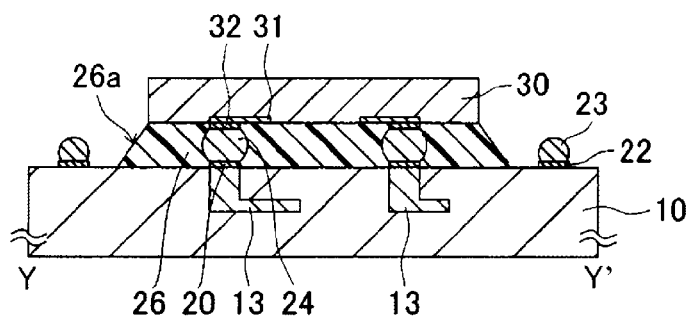

FIG. 1A is a plan view of a semiconductor device according to a present embodiment. FIG. 1B and FIG. 1C are schematic sectional views taken along lines X-X' and Y-Y', respectively, of FIG. 1A.

An electronic circuit section is formed at least on one surface of a first semiconductor chip 10.

A solid-state imaging section 11, for example, is formed as the electronic circuit section described above.

In the solid-state imaging section 11, for example, photodiodes are formed so as to be divided from each other for each pixel, and pixels including photodiodes are arranged in the form of a matrix to form a light receiving surface. For example, an insulating film, a color filter, an on-chip lens and the like are formed on the light receiving surface as required.

In addition, a pad electrode 12, for example, is formed as the electronic circuit section.

The pad electrode 12 is formed of aluminum, for example. The pad electrode 12 is buried in the vicinity of a top layer of the first semiconductor chip 10. A part of the pad electrode 12 is exposed on the top surface side by a pad opening part 12a.

In addition, other peripheral circuit sections such for example as a comparator and a DA converter may be included as the electronic circuit section.

For example, internal wiring 13 connected to the solid-state imaging section 11, the pad electrode 12 and the like is formed so as to be buried within the first semiconductor chip 10.

An under bump film 20 as a first connecting section is formed on the same surface of the first semiconductor chip 10 as the surface of the first semiconductor chip 10 on which surface the electronic circuit section is formed.

On the other hand, wiring 31 and the like are formed on a second semiconductor chip 30, and an under bump film 32 as a second connecting section is formed on one surface of the second semiconductor chip 30.

The second semiconductor chip 30 is mounted on the first semiconductor chip 10, the first semiconductor chip 10 and the second semiconductor chip 30 being connected to each other at the under bump film 20 and the under bump film 32 by bumps 24.

In this case, a dam 25 for filling a gap between the first semiconductor chip 10 and the second semiconductor chip 30 is formed on at least a part of an outer edge of the second semiconductor chip 30 which part is on the side of a region in which the electronic circuit section is formed.

In addition, in the present embodiment, an under bump film 22 is formed on the side of the first semiconductor chip 10, and an under bump film 34 is formed on the side of the second semiconductor chip 30. The above-described dam 25 is formed so as to connect the under bump film 22 and the under bump film 34 to each other. The dam 25 is formed by the same layer as a conductive layer forming the bumps 24. Bumps 23 are formed on the first semiconductor chip 10 in regions other than a region formed such that the gap between the first semiconductor chip 10 and the second semiconductor chip 30 is filled. The dam 25 and the bumps 23 together form a ring shape.

The gap between the first semiconductor chip 10 and the second semiconductor chip 30 is filled with an underfill resin layer 26, the protrusion of the underfill resin layer 26 from the outer edge of the second semiconductor chip 30 to the side of the electronic circuit section being prevented by the dam 25.

In the semiconductor device according to the present embodiment, the underfill resin layer 26 has a fillet 26a at a peripheral part of the second semiconductor chip 30 on which peripheral part the dam 25 is not formed.

However, the above-described dam 25 prevents the protrusion of the underfill resin layer 26 from the outer edge of the second semiconductor chip 30 to the side of the electronic circuit section.

For example, in order to prevent contamination from a reactant gas from the fillet, it is important to secure a distance of 200 μm or more between the fillet and the electronic circuit section.

In the present embodiment, a distance of 200 μm or more can be secured between the fillet of the underfill resin layer 26 and the electronic circuit section such as the solid-state imaging device, the pad electrode and the like.

Therefore, the contamination of the electronic circuit section by a reactant gas emitted at a time of resin curing reaction from the fillet of the underfill resin layer 26 can be prevented.

In the above-described embodiment, a constitution having the solid-state imaging device and the pad electrode as the electronic circuit section has been shown. However, the embodiment is applicable to a case where one of the solid-state imaging device and the pad electrode or an electronic circuit section whose contamination by another reactant gas is desirably avoided is present.

As described above, in the present embodiment, when the electronic circuit section is provided in each of parts adjacent to two opposed sides of the second semiconductor chip, a dam is formed on the two sides. When the electronic circuit section is provided on another side or a plurality of sides, it suffices to form a dam on the side or the plurality of sides.

A material for forming the dam 25 may be formed by a same layer as the bumps formed on the first or second semiconductor chip, or may be a different layer. For example, a metal such as Cu, An, Ti or the like or a soldering material such as Sn, SnAg, SnAgCu, SnCu, AuSn or the like can be used.

Thus, the second semiconductor chip and the electronic circuit section such as the pad electrode, the solid-state imaging device or the like can be brought into proximity to each other, and thus the semiconductor device can be miniaturized.

[Method for Manufacturing Semiconductor Device]
A method for manufacturing the semiconductor device according to the present embodiment will next be described with reference to FIGS. 2A to 6C.

Figure 2A:
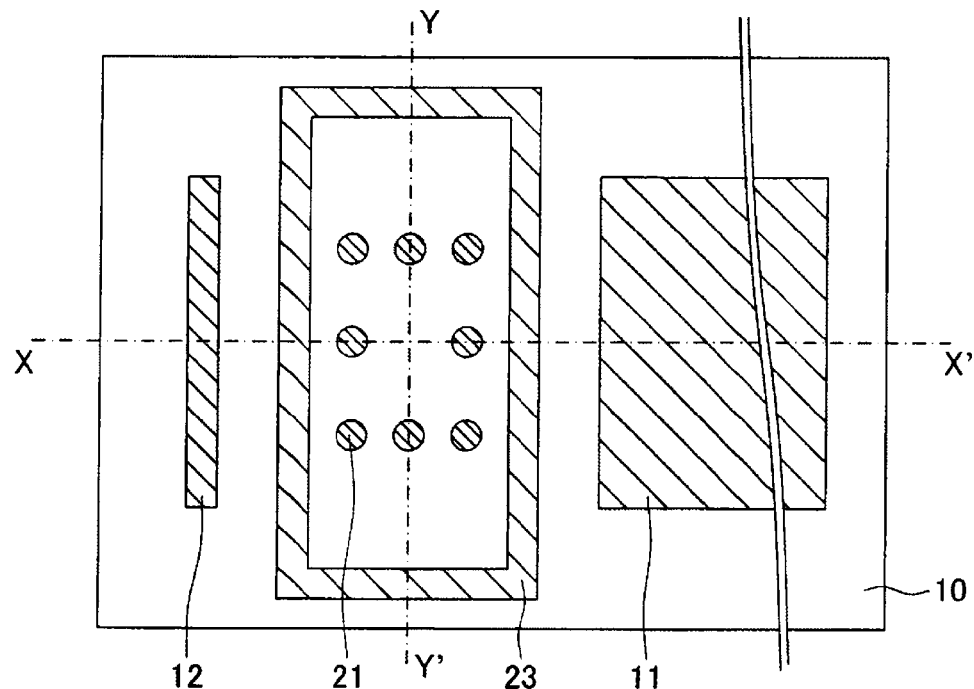
FIG. 2A is a plan view of a first semiconductor chip according to the first embodiment of the present invention.
Figure 2B:
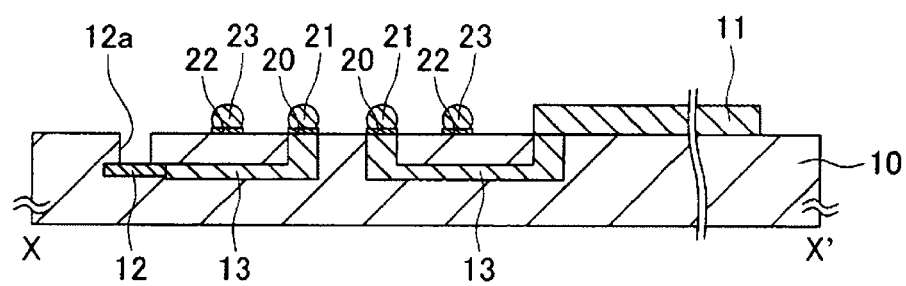
FIG. 2B and FIG. 2C are schematic sectional views taken along lines X-X' and Y-Y', respectively, of FIG. 2A.
Figure 2C:
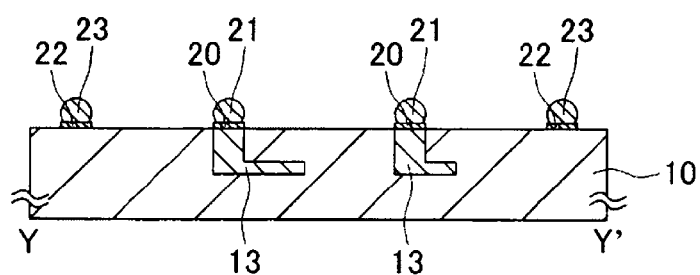

FIG. 2A is a plan view of the first semiconductor chip according to the present embodiment. FIG. 2B and FIG. 2C are schematic sectional views taken along lines X-X' and Y-Y', respectively, of FIG. 2A.

An electronic circuit section is formed at least on one surface of the first semiconductor chip 10. A solid-state imaging section 11, for example, is formed as the above-described electronic circuit section.

In the solid-state imaging section 11, for example, photodiodes are formed so as to be divided from each other for each pixel, and pixels including photodiodes are arranged in the form of a matrix to form a light receiving surface. For example, an insulating film, a color filter, an on-chip lens and the like are formed on the light receiving surface as required.

In addition, a pad electrode 12, for example, is formed as the electronic circuit section.

The pad electrode 12 is formed of aluminum, for example. The pad electrode 12 is formed so as to be buried in the vicinity of a top layer of the first semiconductor chip 10. A pad opening part 12a is formed so as to expose a part of the pad electrode 12.

In addition, other peripheral circuit sections such for example as a comparator and a DA converter may be included as the electronic circuit section.

In addition, for example, internal wiring 13 connected to the solid-state imaging section 11, the pad electrode 12 and the like is formed so as to be buried within the first semiconductor chip 10.

An under bump film 20 as a first connecting section is formed on the same surface of the first semiconductor chip 10 as the surface of the first semiconductor chip 10 on which surface the electronic circuit section is formed.

In addition, an under bump film 22 of a ring shape is formed on a peripheral part of a region for mounting a second semiconductor chip including a region for forming a dam.

Bumps 21 and 23 made of solder or the like are respectively formed on the under bump film 20 and the under bump film 22 described above.

The bump 23 is formed in a ring shape on the peripheral part of the region for mounting the second semiconductor chip as described above.

Figure 3A:
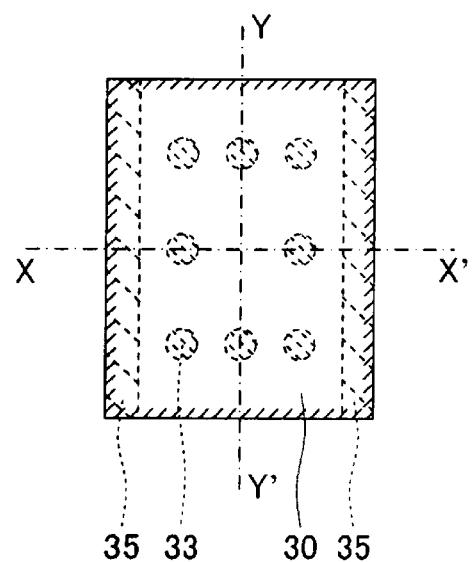
FIG. 3A is a plan view of a second semiconductor chip according to the first embodiment of the present invention.
Figure 3B:
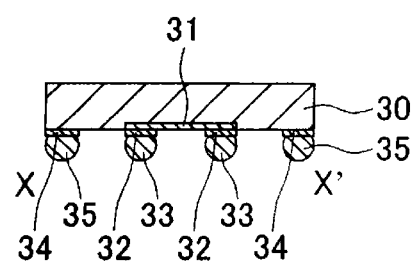
FIG. 3B and FIG. 3C are schematic sectional views taken along lines X-X' and Y-Y', respectively, of FIG. 3A.
Figure 3C:
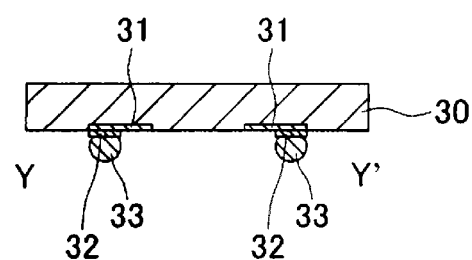

FIG. 3A is a plan view of the second semiconductor chip according to the present embodiment. FIG. 3B and FIG. 3C are schematic sectional views taken along lines X-X' and Y-Y', respectively, of FIG. 3A.

Wiring 31 and the like are formed on the second semiconductor chip 30, and an under bump film 32 as a second connecting section is formed on one surface of the second semiconductor chip 30.

In addition, an under bump film 34 of a linear shape is formed on two sides of an outer edge of the second semiconductor chip, the two sides being a region for forming the dam.

Bumps 33 and 35 made of solder or the like are respectively formed on the under bump film 32 and the under bump film 34 described above.

The bumps 35 are formed in a linear shape on the two sides of the outer edge of the second semiconductor chip as described above.

Figure 4A:
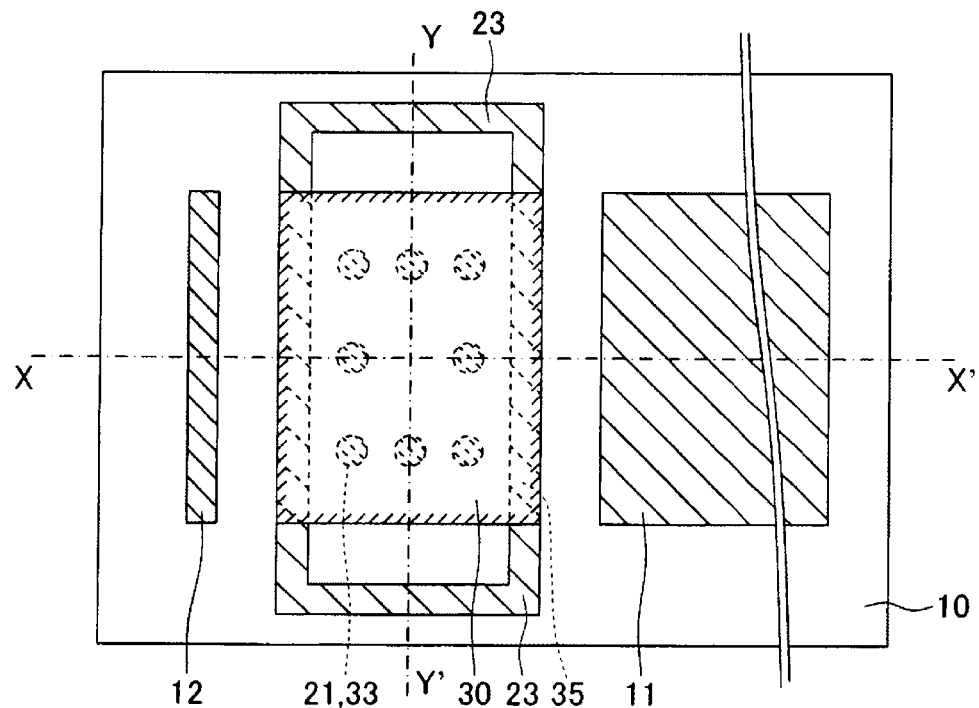
FIG. 4A is a plan view showing a process of manufacturing the semiconductor device according to the first embodiment of the present invention.
Figure 4B:
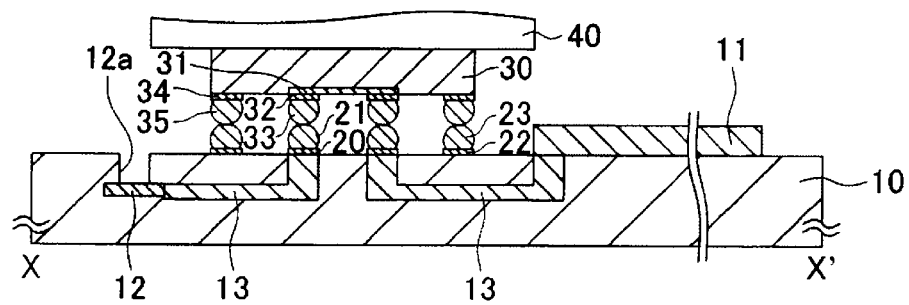
FIG. 4B and FIG. 4C are schematic sectional views taken along lines X-X' and Y-Y', respectively, of FIG. 4A.
Figure 4C:
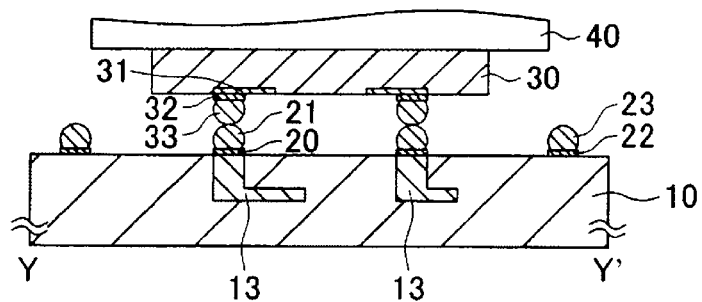

FIG. 4A is a plan view showing a process of manufacturing the semiconductor device according to the present embodiment. FIG. 4B and FIG. 4C are schematic sectional views taken along lines X-X' and Y-Y', respectively, of FIG. 4A.

Using a collet 40 or the like as appropriate, the bumps 21 and the bump 23 of the first semiconductor chip 10 described above are aligned with the bumps 33 and the bumps 35 of the second semiconductor chip 30, and the second semiconductor chip 30 is mounted on the first semiconductor chip 10.

Figure 5A:
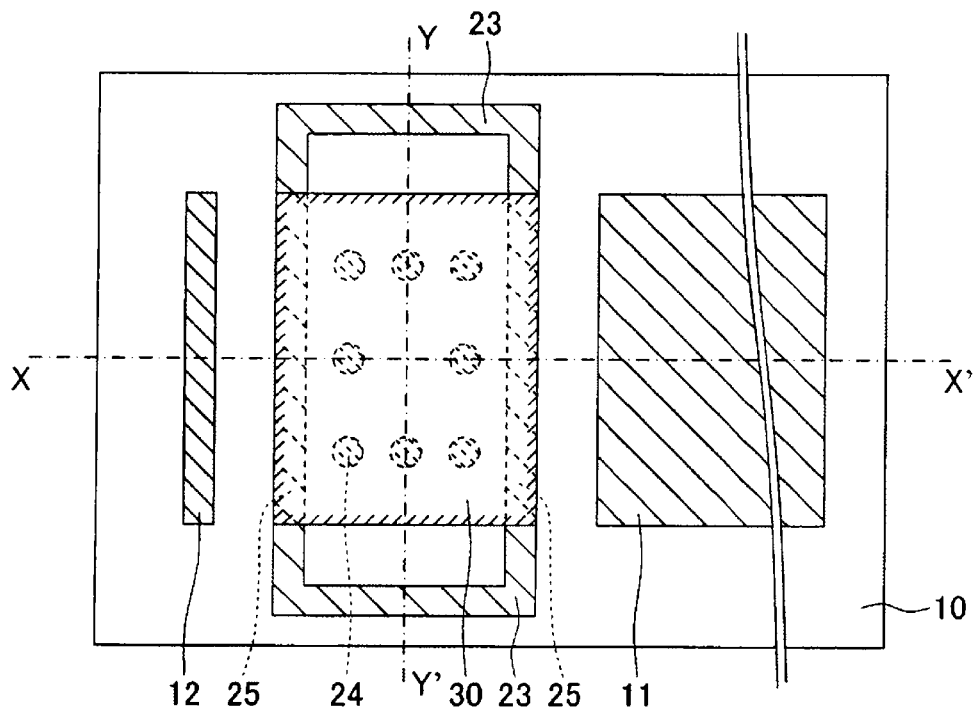
FIG. 5A is a plan view showing a process of manufacturing the semiconductor device according to the first embodiment of the present invention.
Figure 5B:
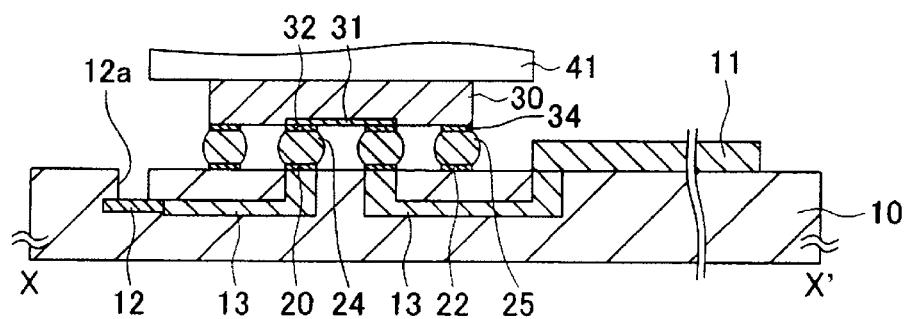
FIG. 5B and FIG. 5C are schematic sectional views taken along lines X-X' and Y-Y', respectively, of FIG. 5A.
Figure 5C:
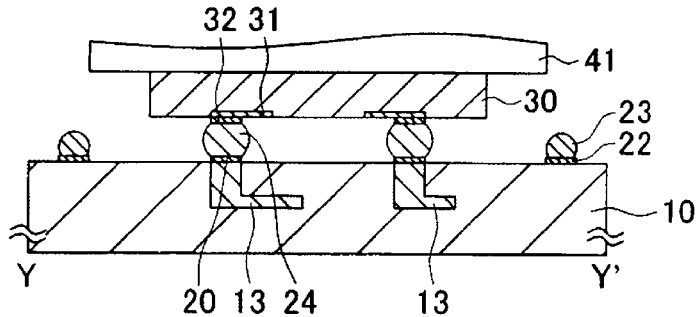

FIG. 5A is a plan view showing a process of manufacturing the semiconductor device according to the present embodiment. FIG. 5B and FIG. 5C are schematic sectional views taken along lines X-X' and Y-Y', respectively, of FIG. 5A.

Using a bonding head 41 or the like as appropriate, a breaking point is produced in a surface oxide film by press contact below a solder melting point, and after heating to a solder melting temperature, the solders are connected to each other by oscillation operation in an X-direction and a Y-direction, so that the bumps 21 and the bumps 33 are integrated into bumps 24.

At the same time as the above, the bump 23 and the bumps 35 are integrated into a dam 25 in the region for forming the dam.

As described above, in the present embodiment, when the electronic circuit section is provided in each of parts adjacent to two opposed sides of the second semiconductor chip, a dam is formed on the two sides. When the electronic circuit section is provided on another side or a plurality of sides, a dam is formed on the side or the plurality of sides.

In addition, no problem is presented even when a flux is applied in advance in connecting the bumps made of solder. Incidentally, the bump 23 and the bumps 35 to form the dam may each be formed at the same time as or separately from the bumps 21 of the first semiconductor chip 10 and the bumps 33 of the second semiconductor chip 30.

Figure 6A:
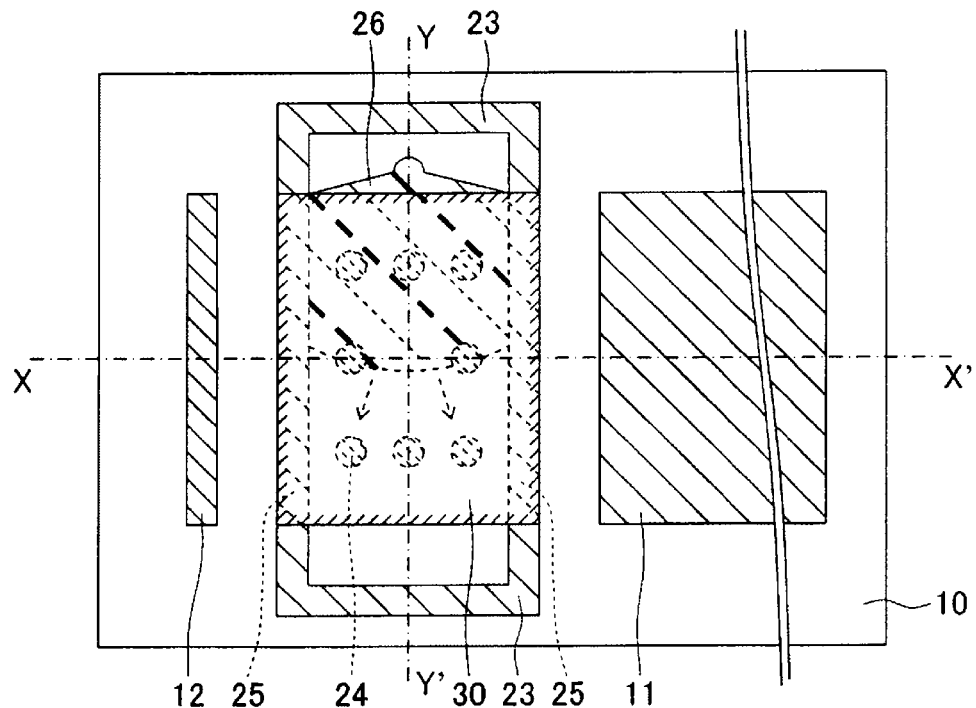
FIG. 6A is a plan view showing a process of manufacturing the semiconductor device according to the first embodiment of the present invention.
Figure 6B:
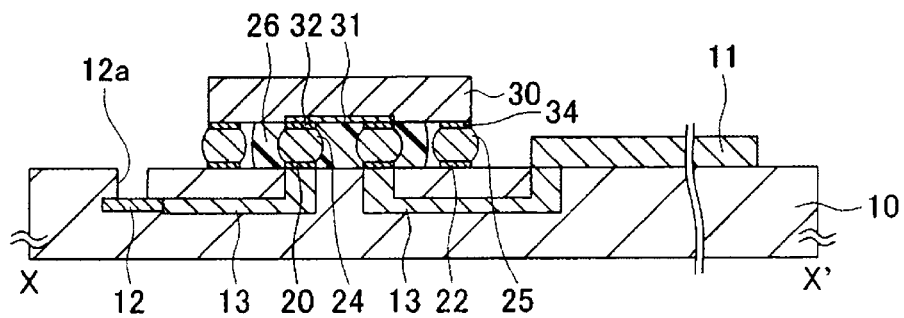
FIG. 6B and FIG. 6C are schematic sectional views taken along lines X-X' and Y-Y', respectively, of FIG. 6A.
Figure 6C:
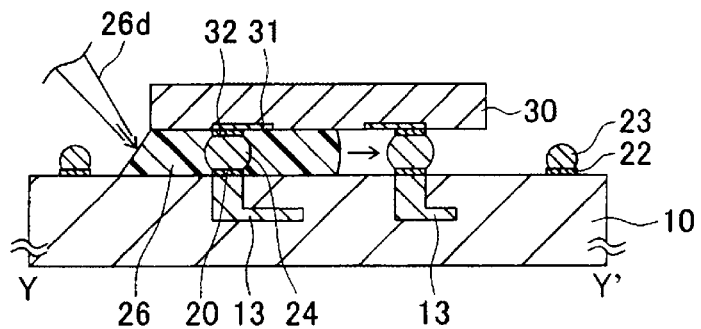

FIG. 6A is a plan view showing a process of manufacturing the semiconductor device according to the present embodiment. FIG. 6B and FIG. 6C are schematic sectional views taken along lines X-X' and Y-Y', respectively, of FIG. 6A.

An underfill resin layer 26 is formed so as to be filled into the gap between the first semiconductor chip 10 and the second semiconductor chip 30, the protrusion of the underfill resin layer 26 from the outer edge of the second semiconductor chip 30 to the side of the electronic circuit section such as the solid-state imaging section 11, the pad electrode 12 and the like being prevented by the dam 25.

Using a dispenser 26d, for example, a resin in a liquid form which resin is to form the underfill resin layer is injected into the gap between the first semiconductor chip 10 and the second semiconductor chip 30.

In filling the above-described resin, a resin injection port and an air outlet port, for example, are desirably formed to secure a passage for an air to escape from the gap between the first semiconductor chip 10 and the second semiconductor chip 30.

As described above, in the present embodiment, the electronic circuit section is provided in each of parts adjacent to two opposed sides of the second semiconductor chip. One of sides other than the above sides is an injection port for the resin, and the other side is an air outlet port.

A thermosetting process is performed after the underfill resin layer 26 is formed by the resin in the gap between the first semiconductor chip 10 and the second semiconductor chip 30 as described above.

In the above thermosetting process, a reactant gas is emitted from the fillet of the underfill resin layer 26.

In the method for manufacturing the semiconductor device according to the present embodiment, the above-described dam 25 prevents the protrusion of the underfill resin layer 26 from the outer edge of the second semiconductor chip 30 to the side of the electronic circuit section.

A distance of 200 μm or more can be secured between the fillet of the underfill resin layer 26 and the electronic circuit section such as the solid-state imaging device, the pad electrode and the like.

Therefore, the contamination of the electronic circuit section by the reactant gas emitted at a time of resin curing reaction from the fillet of the underfill resin layer 26 can be prevented.

Thus, in the method for manufacturing the semiconductor device according to the present embodiment, the second semiconductor chip and the electronic circuit section such as the pad electrode, the solid-state imaging device or the like can be brought into proximity to each other, and thus the semiconductor device can be miniaturized.

<Second Embodiment>
[Constitution of Semiconductor Device]

Figure 7A:
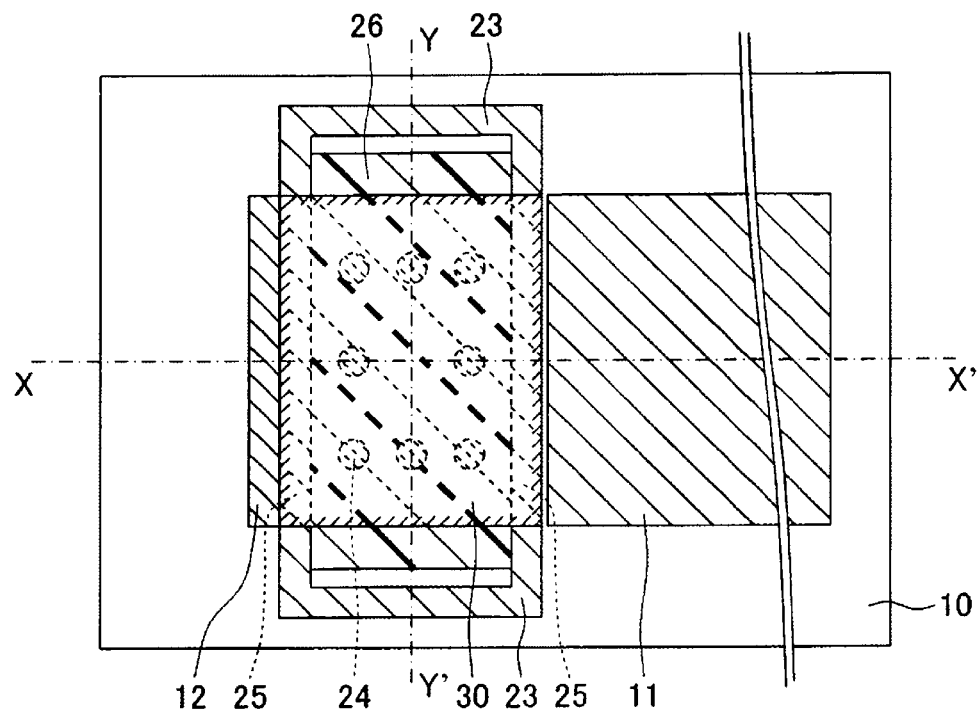
FIG. 7A is a plan view of a semiconductor device according to a second embodiment of the present invention.
Figure 7B:
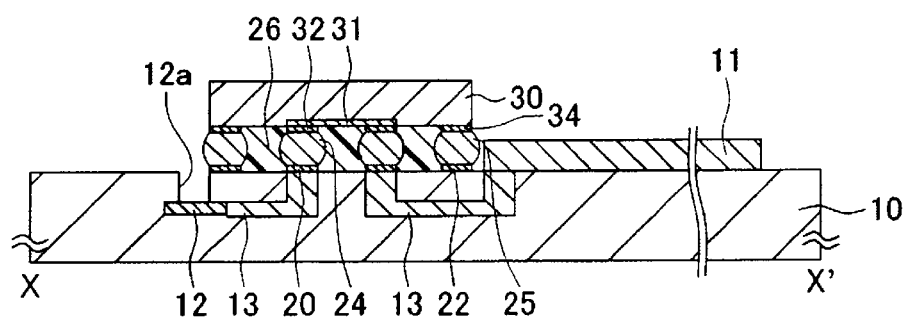
FIG. 7B and FIG. 7C are schematic sectional views taken along lines X-X' and Y-Y', respectively, of FIG. 7A.
Figure 7C:
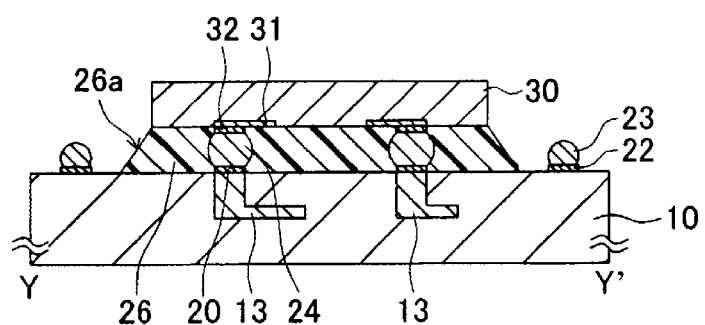

FIG. 7A is a plan view of a semiconductor device according to a present embodiment. FIG. 7B and FIG. 7C are schematic sectional views taken along lines X-X' and Y-Y', respectively, of FIG. 7A.

The fillet of an underfill resin layer 26 is not formed in a region of the periphery of a laminated second semiconductor chip in which region a dam 25 prevents the protrusion of the underfill resin layer 26 from the outer edge of the second semiconductor chip 30 to the side of an electronic circuit section.

The present embodiment has a layout such that the electronic circuit section such as a pad electrode, a solid-state imaging section and the like and the second semiconductor chip are adjacent to each other in the region in which the dam 25 is formed. Being adjacent in this case indicates that a distance between the electronic circuit section and the second semiconductor chip is zero or in the vicinity of zero.

Except for the above, the second embodiment has a similar constitution to that of the first embodiment.

While a fillet is formed in a region in which the above-described dam 25 is not formed, a dam is formed on all sides facing the electronic circuit section. Thus, a sufficient distance of 200 μm or more can be secured as a distance between the fillet and the electronic circuit section even in a part where the fillet and the electronic circuit section are closest to each other.

Therefore, the contamination of the electronic circuit section by a reactant gas emitted at a time of resin curing reaction from the fillet of the underfill resin layer 26 can be prevented.

Thus, the second semiconductor chip and the electronic circuit section such as the pad electrode, the solid-state imaging device or the like can be brought into proximity to each other, and thus the semiconductor device can be miniaturized.

<Third Embodiment>
[Constitution of Semiconductor Device]

Figure 8A:
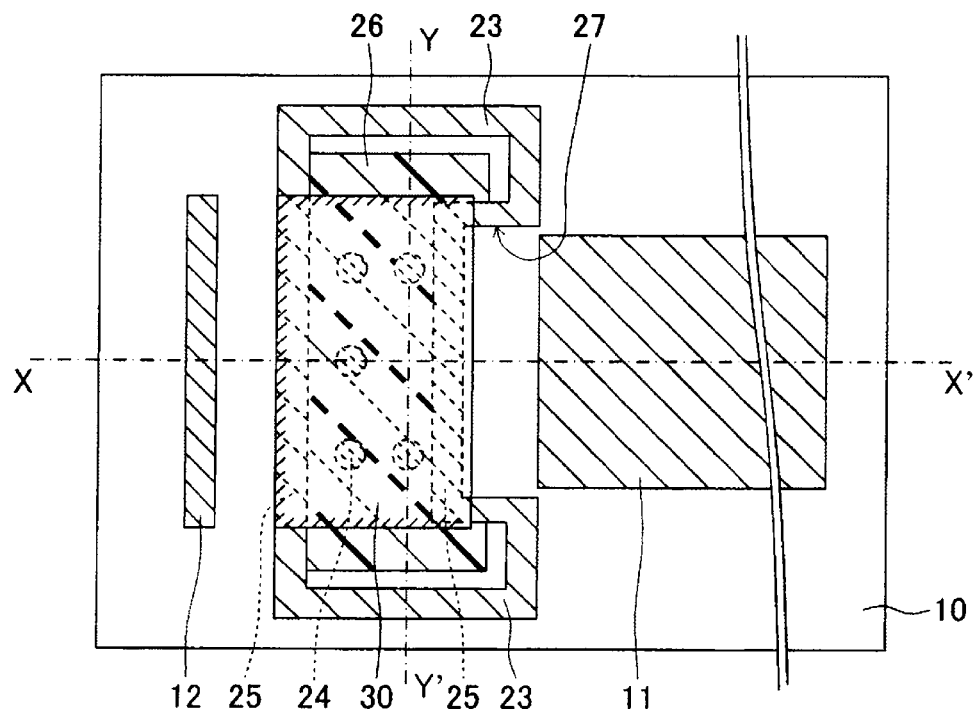
FIG. 8A is a plan view of a semiconductor device according to a third embodiment of the present invention.
Figure 8B:
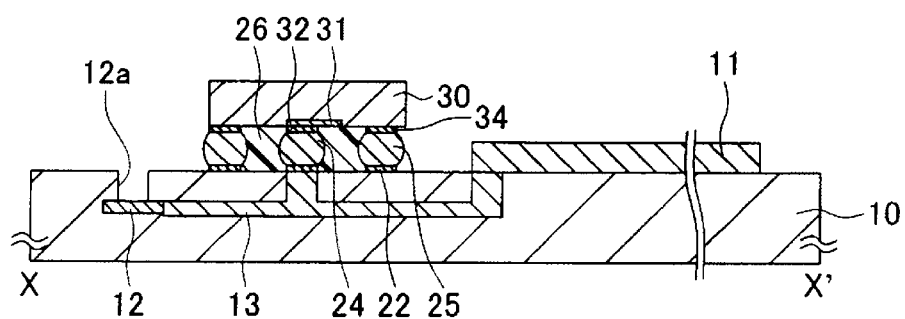
FIG. 8B and FIG. 8C are schematic sectional views taken along lines X-X' and Y-Y', respectively, of FIG. 8A.
Figure 8C:
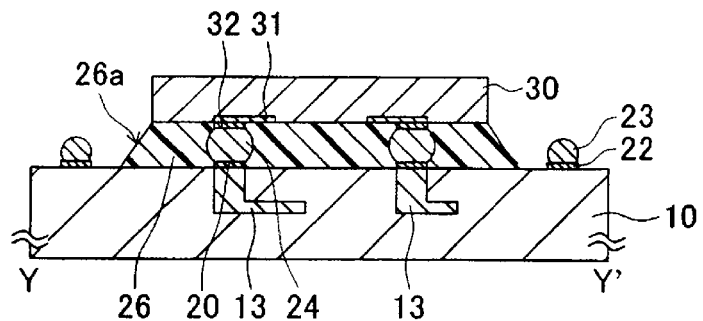

FIG. 8A is a plan view of a semiconductor device according to a present embodiment. FIG. 8B and FIG. 8C are schematic sectional views taken along lines X-X' and Y-Y', respectively, of FIG. 8A.

A dam is formed in a shape along the outer edge of a second semiconductor chip. Specifically, in the present embodiment, a recess-shaped part 27 is formed in a ring-shaped bump 23 on the side of a first semiconductor chip 10 which bump 23 forms a dam in a part in which a solid-state imaging section 11 is laid out close to the region of the second semiconductor chip 30.

When an electronic circuit section such as a pad electrode 12, the solid-state imaging section 11 and the like is present in the vicinity of the second semiconductor chip 30, and the length of the electronic circuit section is shorter than the length of the side wall of the second semiconductor chip 30, it suffices to form a dam only in a part close to the electronic circuit section.

Except for the above, the third embodiment has a similar constitution to that of the first embodiment.

In the semiconductor device according to the present embodiment, an underfill resin layer 26 has a fillet 26a at a peripheral part of the second semiconductor chip 30 on which peripheral part the dam 25 is not formed.

However, the above-described dam 25 prevents the protrusion of the underfill resin layer 26 from the outer edge of the second semiconductor chip 30 to the side of the electronic circuit section.

In the present embodiment, a sufficient distance of 200 μm or more can be secured as a distance between the fillet of the underfill resin layer 26 and the electronic circuit section such as the solid-state imaging device, the pad electrode and the like.

Therefore, the contamination of the electronic circuit section by a reactant gas emitted at a time of resin curing reaction from the fillet of the underfill resin layer 26 can be prevented.

Thus, the second semiconductor chip and the electronic circuit section such as the pad electrode, the solid-state imaging device or the like can be brought into proximity to each other, and thus the semiconductor device can be miniaturized.

As described above, the foregoing effects can be obtained even when the dam formation region is only in the vicinity of the electronic circuit section.

<Fourth Embodiment>
[Method for Manufacturing Semiconductor Device]

Figure 9A:
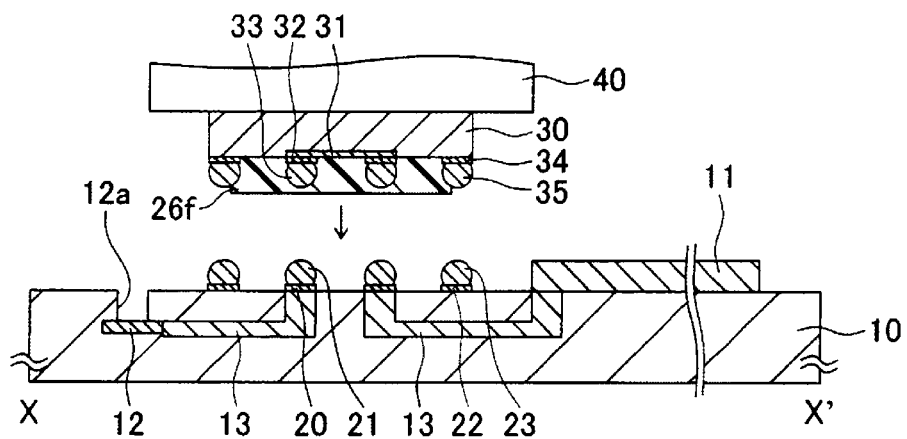
FIG. 9A and FIG. 9B are sectional views showing a process of manufacturing a semiconductor device according to a fourth embodiment of the present invention, and are schematic sectional views corresponding to the lines X-X' and Y-Y' in the semiconductor device shown in FIGS. 1A to 1C.
Figure 9B:
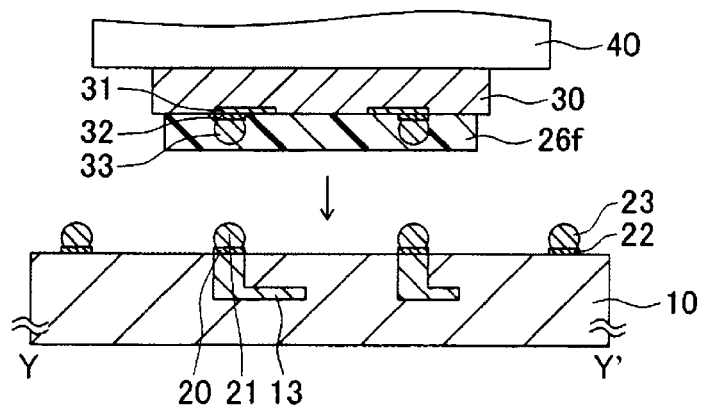

FIG. 9A and FIG. 9B are sectional views showing a process of manufacturing a semiconductor device according to a present embodiment, and are schematic sectional views corresponding to the lines X-X' and Y-Y' in the semiconductor device shown in FIGS. 1A to 1C.

When an underfill resin layer is formed, a film-shaped underfill resin layer 26f may be formed on a second semiconductor chip 30, and the filling of a resin serving as the underfill resin layer may be performed at the same time as the bump connection of a first semiconductor chip 10.

Alternatively, a film-shaped underfill resin layer 26f may be formed on the first semiconductor chip 10, and the filling of a resin serving as the underfill resin layer may be performed at the same time as the bump connection of the second semiconductor chip 30.

As shown in FIG. 9A and FIG. 9B, the film-shaped underfill resin layer 26f is subjected to pressure to fill the gap between the first semiconductor chip 10 and the second semiconductor chip 30, and a surplus is discharged to the outside of the gap. It is therefore important to provide, in advance, a part serving as a resin outlet port from which the surplus can be discharged.

As described above, in the present embodiment, an electronic circuit section is provided in each of parts adjacent to two opposed sides of the second semiconductor chip. The regions of two sides other than the above sides are a resin outlet port.

Except for the above, the fourth embodiment has a similar constitution to that of the first embodiment.

In the method for manufacturing the semiconductor device according to the present embodiment, the above-described dam 25 prevents the protrusion of the underfill resin layer 26 from the outer edge of the second semiconductor chip 30 to the side of the electronic circuit section.

A distance of 200 μm or more can be secured between the fillet of the underfill resin layer 26 and the electronic circuit section such as a solid-state imaging device, a pad electrode and the like.

Therefore, the contamination of the electronic circuit section by a reactant gas emitted at a time of resin curing reaction from the fillet of the underfill resin layer 26 can be prevented.

Thus, in the method for manufacturing the semiconductor device according to the present embodiment, the second semiconductor chip and the electronic circuit section such as the pad electrode, the solid-state imaging section or the like can be brought into proximity to each other, and thus the semiconductor device can be miniaturized.

<Fifth Embodiment>
[Constitution of Semiconductor Device]

Figure 10A:
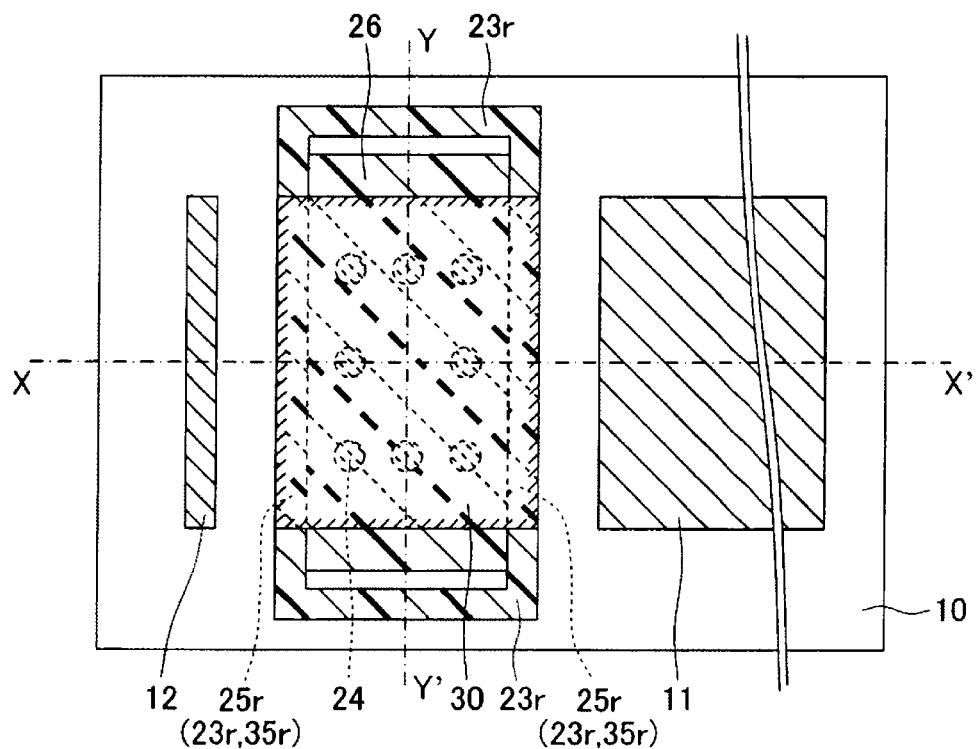
FIG. 10A is a plan view of a semiconductor device according to a fifth embodiment of the present invention.
Figure 10B:
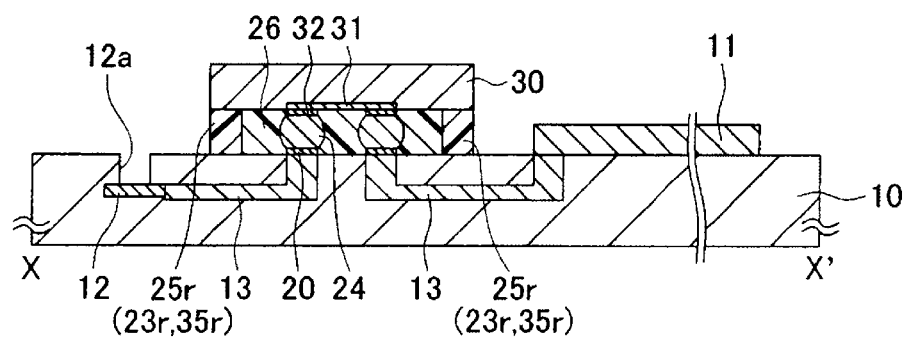
FIG. 10B and FIG. 10C are schematic sectional views taken along lines X-X' and Y-Y', respectively, of FIG. 10A.
Figure 10C:
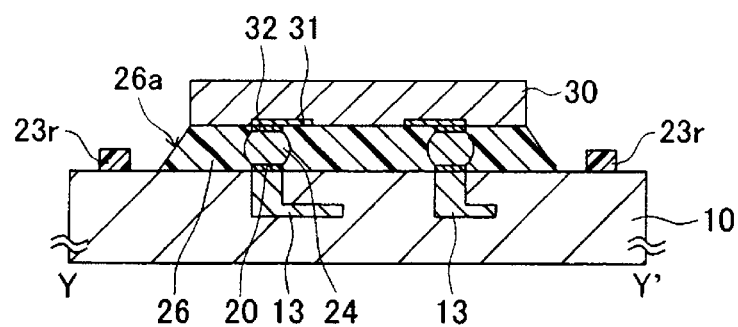

FIG. 10A is a plan view of a semiconductor device according to a present embodiment. FIG. 10B and FIG. 10C are schematic sectional views taken along lines X-X' and Y-Y', respectively, of FIG. 10A.

A dam for preventing the protrusion of an underfill resin layer 26 from the outer edge of a second semiconductor chip 30 to the side of an electronic circuit section may be a resin material. A concrete example of the resin material is a photosensitive curing resin or a thermosetting resin such as an epoxy resin, an acrylic resin or the like.

Specifically, in the present embodiment, a resin layer 23r is formed in place of the under bump film 22 and the bump 23 on the side of a first semiconductor chip 10.

A resin layer 35r is formed in place of the under bump film 34 and the bumps 35 on the side of the second semiconductor chip 30.

Further, a dam 25r made of resin is formed with the above-described resin layer 23r and the resin layer 35r adhering to each other on a peripheral part of the second semiconductor chip 30 on the side of the electronic circuit section.

Except for the above, the fifth embodiment has a similar constitution to that of the first embodiment.

In the semiconductor device according to the present embodiment, the underfill resin layer 26 has a fillet 26a at a peripheral part of the second semiconductor chip 30 on which peripheral part the dam 25r is not formed.

However, the above-described dam 25r prevents the protrusion of the underfill resin layer 26 from the outer edge of the second semiconductor chip 30 to the side of the electronic circuit section.

In the present embodiment, a sufficient distance of 200 μm or more can be secured as a distance between the fillet of the underfill resin layer 26 and the electronic circuit section such as a solid-state imaging device, a pad electrode and the like.

Therefore, the contamination of the electronic circuit section by a reactant gas emitted at a time of resin curing reaction from the fillet of the underfill resin layer 26 can be prevented.

Thus, the second semiconductor chip and the electronic circuit section such as the pad electrode, the solid-state imaging section or the like can be brought into proximity to each other, and thus the semiconductor device can be miniaturized.

[Method for Manufacturing Semiconductor Device]

Figure 11A:
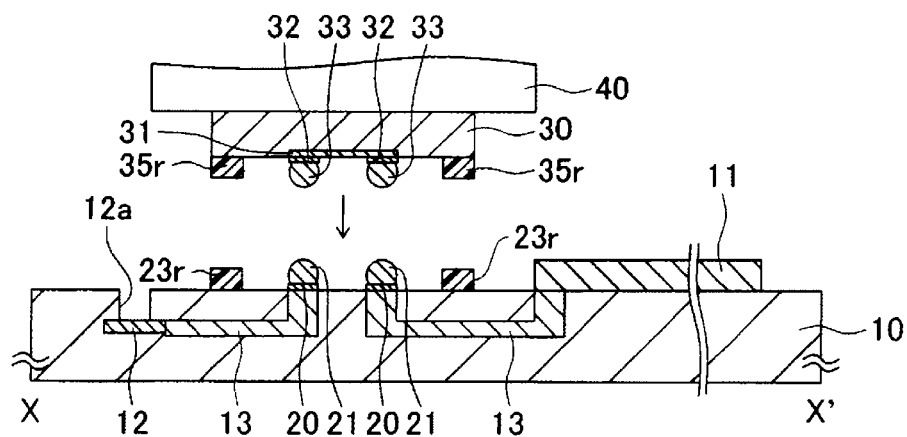
FIG. 11A and FIG. 11B are sectional views showing a process of manufacturing the semiconductor device according to the fifth embodiment of the present invention, and are schematic sectional views corresponding to the lines X-X' and Y-Y' in the semiconductor device shown in FIGS. 10A to 10C.
Figure 11B:
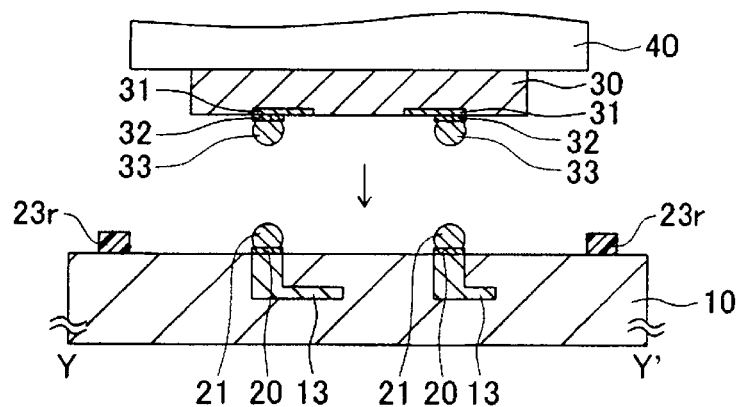

FIG. 11A and FIG. 11B are sectional views showing a process of manufacturing a semiconductor device according to a present embodiment, and are schematic sectional views corresponding to the lines X-X' and Y-Y' in the semiconductor device shown in FIGS. 10A to 10C.

In the present embodiment, a resin layer 23r is pattern-formed in place of the under bump film 22 and the bump 23 on the side of a first semiconductor chip 10.

In addition, a resin layer 35r is pattern-formed in place of the under bump film 34 and the bumps 35 on the side of a second semiconductor chip 30.

A method for pattern-forming the resin can be carried out by forming a resin material into a film by film lamination, spin coating or the like and performing a photolithography process or the like.

A photosensitive curing resin or a thermosetting resin such as an epoxy resin or an acrylic resin, for example, can be used as the resin layer 23r and the resin layer 35r.

Next, a dam 25r made of resin is formed with the resin layer 23r and the resin layer 35r adhering to each other on a peripheral part of the second semiconductor chip 30 on the side of the electronic circuit section.

Heating at the time of bump connection or separate curing is performed for adhesion between the resin layer 23r and the first semiconductor chip 10, between the resin layer 35r and the second semiconductor chip 30, and between the resin layer 23r and the resin layer 35r.

Except for the above, the fifth embodiment has a similar constitution to that of the first embodiment.

In the method for manufacturing the semiconductor device according to the present embodiment, the above-described dam 25r prevents the protrusion of the underfill resin layer 26 from the outer edge of the second semiconductor chip 30 to the side of the electronic circuit section.

A distance of 200 μm or more can be secured between the fillet of the underfill resin layer 26 and the electronic circuit section such as a solid-state imaging section, a pad electrode and the like.

Therefore, the contamination of the electronic circuit section by a reactant gas emitted at a time of resin curing reaction from the fillet of the underfill resin layer 26 can be prevented.

Thus, in the method for manufacturing the semiconductor device according to the present embodiment, the second semiconductor chip and the electronic circuit section such as the pad electrode, the solid-state imaging section or the like can be brought into proximity to each other, and thus the semiconductor device can be miniaturized.

<Sixth Embodiment>
[Application to Electronic Device]

Figure 12:
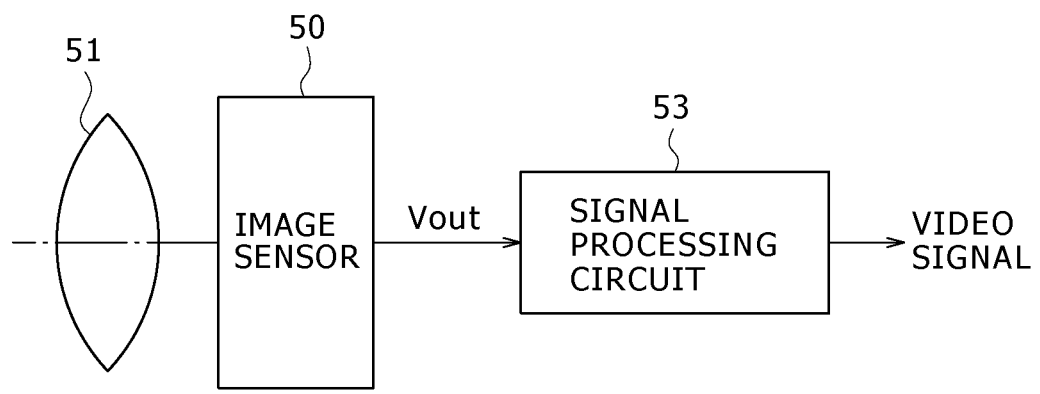
FIG. 12 is a schematic block diagram of an electronic device according to a sixth embodiment.

FIG. 12 is a schematic block diagram of an electronic device as an electronic device according to a present embodiment. The electronic device according to the present embodiment is an example of a video electronic device capable of photographing a still image or photographing a moving image.

The electronic device according to the present embodiment has an image sensor (semiconductor device having a solid-state imaging element section) 50, an optical system 51, a signal processing circuit 53, and the like.

In the present embodiment, the semiconductor device having the solid-state imaging element section according to each of the foregoing embodiments is incorporated as the above-described image sensor 50.

The optical system 51 forms an image of image light (incident light) from a subject onto the image pickup surface of the image sensor 50. Thus, a corresponding signal charge is accumulated within the image sensor 50 in a certain period. The accumulated signal charge is extracted as an output signal Vout.

A shutter device controls a period of irradiation of the image sensor 50 with light and a period of shielding the image sensor 50 from light.

The image processing section supplies a driving signal for controlling the transfer operation of the image sensor 50 and the shutter operation of the shutter device. The signal transfer of the image sensor 50 is performed according to the driving signal (timing signal) supplied from the image processing section. The signal processing circuit 53 subjects the output signal Vout of the image sensor 50 to various signal processing, and then outputs the result as a video signal. The video signal resulting from the signal processing is stored on a storage medium such as a memory or the like, or output to a monitor.

In addition, the present invention is not limited to application to solid-state imaging element sections for sensing a distribution of amounts of incident visible light and picking up the distribution as an image, the solid-state imaging element sections being provided in semiconductor devices.

The present invention is applicable to solid-state imaging sections for picking up a distribution of amounts of incidence of infrared rays, X-rays, or particles or the like as an image and, in a broad sense, solid-state imaging sections in general such as fingerprint detecting sensors and the like for sensing a distribution of another physical quantity such as pressure, capacitance or the like, and picking up the distribution as an image.

In addition, the present invention is applicable to for example digital still electronic devices, video electronic devices, and electronic devices having an imaging function such as portable telephones.

The image sensor 50 described above can be used as a semiconductor device having a solid-state imaging element section, which is an electronic device module or the like for video electronic devices and digital still electronic devices as well as mobile devices such as portable telephones.

The present invention is not limited to the above description.

For example, while a pad electrode and a solid-state imaging section have been described as an electronic circuit section, an embodiment of the present invention is applicable to other electronic circuit sections.

The embodiment of the present invention is applicable to various sensors such as a CMOS (Complementary Metal Oxide Semiconductor) image sensor and a CCD (Charge Coupled Device) image sensor as the solid-state imaging section.

In addition, various changes can be made without departing from the spirit of the present invention.

It should be understood by those skilled in the art that various modifications, combinations, sub-combinations and alterations may occur depending on design requirements and other factor in so far as they are within the scope of the appended claims or the equivalents thereof.

What is claimed is:

1. An imaging device comprising:
   a first substrate including an electronic circuit section and a first connection section, wherein the electronic circuit section includes a plurality of pixels;
   a second substrate including a second connection section, the second substrate being mounted on the first substrate with the first connection section and the second connection section connected to each other by a connecting member, wherein the connecting member is between the first substrate and the second substrate on at least a part of an outer edge of the second substrate, the part of the outer edge of the second substrate being at a side of a region of formation of the electronic circuit section and at a side opposite to the region of formation of the electronic circuit section; and
   a filling layer formed between the first substrate and the second substrate, wherein the filling layer includes a protrusion from at least the part of the outer edge of the second substrate where the connecting member is not formed.

2. The imaging device according to claim 1, wherein the filing layer is an underfill resin layer.

3. The imaging device according to claim 1, wherein the electronic circuit section including the plurality of pixels is connected to a third connection section of the second substrate.

4. The imaging device according to claim 1, further including an internal wiring within the first substrate.

5. The imaging device according to claim 4, wherein the electronic circuit section including the plurality of pixels is connected to a third connection section of the second substrate via the internal wiring.

6. The imaging device according to claim 1, further including at least one pad electrode within the first substrate.

7. The imaging device according to claim 6, wherein the second substrate includes a third connection section, wherein the first substrate includes a fourth connection section connected to the third connection section by a second connecting member, wherein the second connecting member is between the first substrate and the second substrate on at least the part of the outer edge of the second substrate being on a side of a region of formation of the at least one pad electrode.

8. The imaging device according to claim 7, wherein the filling layer includes a second protrusion from at least the part of the outer edge of the second substrate where the second connecting member is not formed.

9. An electronic device comprising:
   an imaging device;
   an optical system for guiding incident light to an imaging section of the imaging device; and
   a signal processing circuit for processing an output signal of the imaging device,
   wherein the imaging device includes:
   a first substrate including an electronic circuit section and a first connection section, wherein the electronic circuit section includes a plurality of pixels,
   a second substrate including a second connection section, the second substrate being mounted on the first substrate with the first connection section and the second connection section connected to each other by a connecting member, wherein the connecting member is between the first substrate and the second substrate on at least a part of an outer edge of the second substrate, the part of the outer edge of the second substrate being at a side of a region of formation of the electronic circuit section and at a side opposite to the region of formation of the electronic circuit section, and
   a filling layer formed between the first substrate and the second substrate, wherein the filling layer includes a protrusion from at least the part of the outer edge of the second substrate where the connecting member is not formed.

10. The electronic device according to claim 9, wherein the filing layer is an underfill resin layer.

11. The electronic device according to claim 9, wherein the electronic circuit section including the plurality of pixels is connected to a third connection section of the second substrate.

12. The electronic device according to claim 9, further including an internal wiring within the first substrate.

13. The electronic device according to claim 12, wherein the electronic circuit section including the plurality of pixels is connected to a third connection section of the second substrate and the second connection section via the internal wiring.

14. The electronic device according to claim 9, further including at least one pad electrode within the first substrate.

15. A method of manufacturing an imaging device, the method comprising:
   forming an electronic circuit section and a first connection section on a first substrate, wherein the electronic circuit section includes a plurality of pixels;
   forming a second connection section on at least a part of an outer edge of a second substrate;

mounting the second substrate to the first substrate such that a connecting member is between the first substrate and the second substrate on at least the part of the outer edge of the second substrate, the part of the outer edge of the second substrate being at a side of a region of formation of the electronic circuit section and at a side opposite to the region of formation of the electronic circuit section; and forming a filling layer between the first substrate and the second substrate, wherein the filling layer includes a protrusion from at least the part of the outer edge of the second substrate where the connecting member is not formed.

16. The method of manufacturing according to claim 15, wherein the filling layer is an underfill resin layer.

17. The method of manufacturing according to claim 15, wherein the electronic circuit section including the plurality of pixels is connected to a third connection section of the second substrate.

18. The method of manufacturing according to claim 15, further including forming an internal wiring within the first substrate.

19. The method of manufacturing according to claim 18, wherein the electronic circuit section including the plurality of pixels is connected to a third connection section of the second substrate of the second connection section via the internal wiring.

20. The method of manufacturing according to claim 15, further including forming at least one pad electrode within the first substrate.

\* \* \* \* \*